United States Patent
Guo (10) Patent No.: US 8,532,961 B2
(45) Date of Patent: Sep. 10, 2013

(54) METHOD AND SYSTEM TO ACCOUNT FOR ANGLE OF ATTACK EFFECTS IN ENGINE NOISE SHIELDING TESTS

(75) Inventor: Yueping Guo, Seal Beach, CA (US)

(73) Assignee: The Boeing Company, Chicago, IL (US)

( * ) Notice: Subject to any disclaimer, the term of this patent is extended or adjusted under 35 U.S.C. 154(b) by 405 days.

(21) Appl. No.: 12/916,451

(22) Filed: Oct. 29, 2010

(65) Prior Publication Data
US 2012/0109585 A1    May 3, 2012

(51) Int. Cl.
| | | |
|---|---|---|
| *H03F 1/26* | (2006.01) | |
| *B64C 1/40* | (2006.01) | |
| *G05B 13/02* | (2006.01) | |
| *G06G 7/48* | (2006.01) | |

(52) U.S. Cl.
USPC .................. 702/191; 244/1 N; 700/30; 703/8

(58) Field of Classification Search
USPC ................. 702/191, 33, 35, 81, 84, 108, 111, 702/113, 127, 138–140, 142, 144, 175, 182–183, 702/189, 194, 199; 244/1 N; 700/28–32, 700/52, 95, 97, 108–109, 117; 703/1–2, 703/8

See application file for complete search history.

(56) References Cited

U.S. PATENT DOCUMENTS 7,484,589 B2    2/2009    Guo

OTHER PUBLICATIONS

Golub et al., Test-Engine and Inlet Performance of an Aircraft Used for Investigating Flight Effects on Fan Noise, Apr. 1984, NASA Technical Paper 2254, 71 pp.*

Michael J. Czech et al., "Propulsion Airframe Aeroacoustic Integration Effects for a Hybrid Wing Body Aircraft Configuration", 16th AIAA/CEAS Aeroacoustics Conference, AAIA 2010-3912, 2010, pp. 1-23, American Institute of Aeronautics and Astronautics, Inc.

Dimitri Papamoschou et al., "Experiments on Shielding of Jet Noise by Airframe Surfaces", 15th AIAA/CEAS Aeroacoustics Conference (30th AIAA Aeroacoustics Conference), May 11-13, 2009, Miami, Florida, AIAA 2009-3326, 2009, pp. 1-16, American Institute of Aeronautics and Astronautics, Inc.

R.L.M. Wong et al., "Shielding Concepts for Jet Noise", AIAA 7th Aeroacoustics Conference, Oct. 5-7, 1981, Palo Alto, California, AIAA-81/2020, 1981, pp. 1-12, American Institute of Aeronautics and Astronautics, Inc.

R.W. Jeffery et al., "An Experimental Investigation of Noise-Shielding Effects for a Delta-Winged Aircraft in Flight, Wind Tunnel and Anechoic Room", AIAA 2nd Aero-Acoustics Conference, Hampton, VA, Mar. 24-26, 1975, AIAA-75-513, 1975, pp. 1-10, American Institute of Aeronautics and Astronautics, Inc.

(Continued)

*Primary Examiner* — Toan Le (57) ABSTRACT

There is provided a method to account for aircraft angle of attack effects in engine noise shielding in aircraft configurations having one or more engines mounted above a wing or a lifting body. The method includes computing a local flow field from a known standard full aircraft configuration oriented at a nonzero angle of attack. The method further includes computing a mean flow field in a test dataset from a small scale aircraft model test configuration oriented at a zero angle of attack. The method further includes matching the local flow field with the mean flow field to identify a selected noise measurement dataset. The method further includes rotating the selected noise measurement dataset in a far field directivity rotation angle to match the nonzero angle of attack, thus resulting in engine noise shielding results for the full aircraft configuration at the nonzero angle of attack.

24 Claims, 9 Drawing Sheets

(56) References Cited

OTHER PUBLICATIONS

V.M. Conticelli et al., "Noise Shielding Effects for Engine-Over-Wing Installations", AIAA 2nd Aero-Acoustics Conference, Hampton, VA, Mar. 24-26, 1975, AIAA-75-474, 1975, pp. 1-15, American Institute of Aeronautics and Astronautics, Inc.

Wild et al, "An integrated design approach for low noise exposing high-lift devices", 3rd AIAA Flow Control Conference 2006, vol, 1, 2006, pp. 17-32.

Casalino et al: "Aeroacoustics research in Europe : The CEAS-ASC report on 2009 highlights", Journal of Sound & Vibration, London, GB , vol, 329, No. 22, Oct. 25, 2010.

Juve et al: "Aeroacoustics research in Europe: The CEAS-ASC report on 2008 highlights", Journal of Sound & Vibration, London, GB, vol. 328, No. 1-2, Nov. 27, 2009.

Crichton et al: "Design and operation for ultra low noise take—off", 45th AIAA Aerospace Sciences Meeting 2007, American Institute of Aeronautics and Astronautics Inc. US, vol. 8, 2007.

PCT/US2011/050857, International Search Report dated Jun. 21, 2012.

* cited by examiner

METHOD AND SYSTEM TO ACCOUNT FOR ANGLE OF ATTACK EFFECTS IN ENGINE NOISE SHIELDING TESTS

CROSS-REFERENCE TO RELATED APPLICATIONS (Not Applicable)

STATEMENT RE: FEDERALLY SPONSORED RESEARCH/DEVELOPMENT (Not Applicable)

FIELD

The disclosure relates generally to engine noise shielding tests and predictions, and more particularly, to aircraft engine noise shielding tests and predictions with full account of the effects of aircraft angle of attack.

BACKGROUND

Aircraft engines can generate significant sound during operation. The sound pressure level produced by aircraft engines is typically referred to as "engine noise". In particular, engine noise generated during takeoff and landing of commercial aircraft can be the dominant component of the total aircraft noise propagating to the surrounding communities on the ground. For aircraft with engines installed underneath the aircraft's wings, engine noise may be amplified by the lower surface of the wing because the portion of the sound produced by the engines that would otherwise radiate upward is reflected downward off of the lower surface of the wing. In hybrid or blended wing body aircraft, engines can be mounted above the wings or the lifting body and can yield some reduction in downward, forward, and/or sideline emanating noise via the principle of noise shielding. Known noise shielding devices can deflect the downward radiating noise so that surrounding communities on the ground will be affected less by the engine noise. However, known reliable methods and processes for predicting engine noise shielding are lacking, and the lack of such reliable methods and processes necessitates reliance on engine noise shielding tests to help predict engine noise shielding in aircraft and to help understand the engine noise source as it relates to shielding.

A factor to consider in engine noise shielding tests is aircraft angle of attack. For purposes of this application, "aircraft angle of attack" is the angle between a chord line of an airfoil, or the wing of a fixed-wing aircraft, or a lifting body that generates lift and serves as a fuselage, such as the hybrid wing and blended wing body, and the vector representing the relative air flow between the aircraft and the atmosphere. The relative air flow is the flow of air past the airfoil or wing relative to the path of flight of the aircraft. In particular, aircraft angle of attack has significant effects on engine noise shielding in hybrid or blended wing body aircraft configurations where the engine is mounted above the wing or the lifting body of the aircraft (see FIGS. 1, 3). This is because the wing or the lifting body at nonzero angles of attack can significantly alter the air flow in front of the engine, due to the effect of lift generation. On the top of the wing or lifting body, the flow velocity is typically higher than a uniform mean flow velocity upstream of the aircraft because of the circulation induced by the wing or the lifting body. The higher inflow velocity experienced by the engine can, in turn, significantly change the engine noise sources, in spectral features, absolute levels, as well as spatial distributions, in comparison with an engine in a uniform mean flow equal to that upstream of the aircraft. This not only affects the engine noise radiation efficiency but also impacts the engine noise shielding efficiency, since the engine noise shielding efficiency typically depends on how the engine noise sources are distributed. Thus, aircraft conditions of nonzero flight angles of attack are known to have significant effects on engine noise sources and noise shielding efficiency.

Known methods and systems to resolve the issue of nonzero angles of attack include conducting large scale or full scale tests, such as using full aircraft configuration set-ups. However, full aircraft configuration set-ups can be very expensive to set up and use and typically require large testing facilities and many months of advance preparation. For such full configuration set-ups, such as one using a wind tunnel assembly (see FIG. 2), model dimensions and engine sizes need to be in proportion and large enough to simulate realistic flows, which in turn, require large wind tunnels, and to simulate the local geometry of the fully installed configurations. As an alternative to full configuration set-ups using a wind tunnel assembly, full scale flight tests may be conducted. However, such full scale flight tests can be even more expensive, time consuming, and difficult to execute than tests using full aircraft configuration set-ups.

Figure 4:
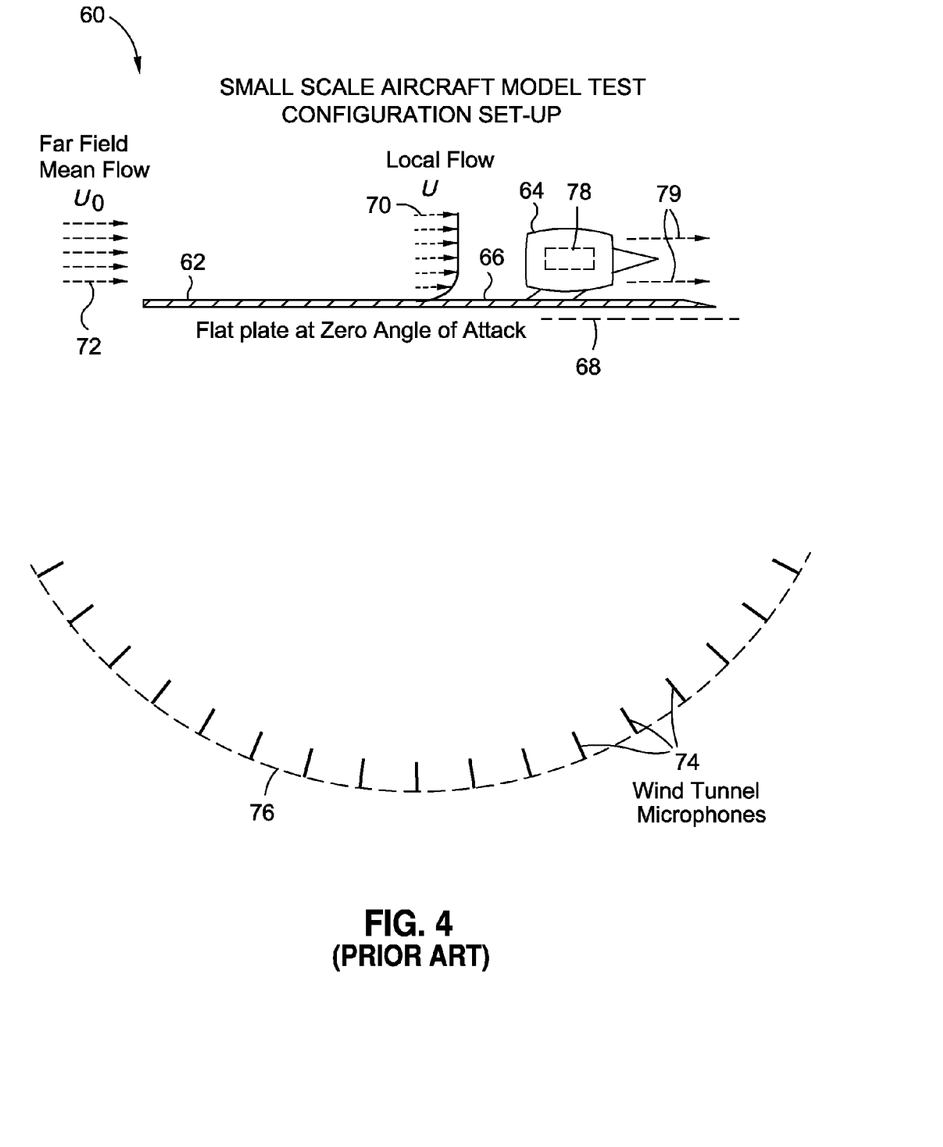
FIG. 4 is an illustration of a schematic diagram showing a side view of a prior art small scale aircraft model test configuration set-up at a zero angle of attack.

Constraints in test facilities and resource availability often require the engine noise shielding test configurations to be simplified to small scale test configuration set-ups, such as an engine mounted on a flat plate (see FIG. 4). However, such engine noise shielding tests that use simplified small scale test configuration set-ups can exclude the test conditions of nonzero angles of attack of aircraft which are known to have significant effects on engine noise sources and the noise shielding efficiency and which are often of primary interest for practical applications. Moreover, in the absence of expensive full aircraft configuration tests or full scale flight tests, engine noise shielding typically uses data from simplified small scale test configuration set-up conditions, as measured, even though errors due to such small scale test configuration mismatch can be unacceptable.

Accordingly, there is a need in the art for a method and system to account for aircraft angle of attack effects in engine noise shielding tests that provide advantages over known methods and systems.

SUMMARY

This need for a method and system to account for aircraft angle of attack effects in engine noise shielding tests is satisfied. As discussed in the below detailed description, embodiments of the method and system may provide significant advantages over existing methods and systems.

In an embodiment of the disclosure, there is provided a method to account for aircraft angle of attack effects in engine noise shielding tests in aircraft configurations having one or more engines mounted above a wing or a lifting body. The method comprises computing a local flow field from a known standard full aircraft configuration oriented at a nonzero angle of attack. The method further comprises computing a mean flow field in a test dataset from a small scale aircraft model test configuration oriented at a zero angle of attack. The method further comprises matching the local flow field with the mean flow field to identify a selected noise measurement dataset. The method further comprises rotating the selected noise measurement dataset in a far field directivity rotation angle to match the nonzero angle of attack, thus resulting in engine noise shielding results for the full aircraft configuration at the nonzero angle of attack.

In another embodiment of the disclosure, there is provided a method for determining operational engine output noise levels as related to angles of attack in aircraft configurations for which one or more engines are mounted above a wing or a lifting body and substantially shielded by the wing or the lifting body. The method comprises computing with a computer software program product on a computer a computed overall mean flow from a known standard full aircraft configuration oriented at a nonzero angle of attack. The method further comprises computing with the computer software program product on the computer a local flow field using the computed overall mean flow and a plurality of local flow parameters from the known standard full aircraft configuration. The method further comprises computing with the computer software program product on the computer a mean flow field in a test dataset from a small scale aircraft model test configuration oriented at a zero angle of attack. The method further comprises comparing with the computer software program product on the computer the local flow field to the mean flow field. If there is a match between the local flow field and the mean flow field, the mean flow field is selected as a dataset identification. If there is no match between the local flow field and the mean flow field, dataset interpolation is performed to select the dataset identification. The method further comprises rotating with the computer software program product on the computer the selected dataset in a far field directivity rotation angle to match the nonzero angle of attack, thus resulting in engine output noise level results for the full aircraft configuration at the nonzero angle of attack.

In another embodiment of the disclosure, there is provided a system to account for aircraft angle of attack effects in engine noise shielding tests in aircraft configurations having one or more engines mounted above a wing or a lifting body. The system may be implemented with a computer software program product stored on a computer readable storage medium on a computer. The system comprises a flow computation element that generates a computed mean flow from a known standard full aircraft configuration oriented at a nonzero angle of attack. The system further comprises a local flow extraction element that generates a local flow field from the full aircraft configuration. The system further comprises a data extraction element that generates a mean flow field from a small scale aircraft model test configuration oriented at a zero angle of attack. The system further comprises a local flow matching element that generates a plurality of local flow matching conclusions. The system further comprises a dataset identification element comprising a noise measurement dataset from the small scale aircraft model test configuration. The system further comprises a directivity rotation element that generates a noise dataset for the full aircraft configuration. The system further comprises a results dataset comprising engine noise shielding for the full aircraft configuration at the nonzero angle of attack.

The features, functions, and advantages that have been discussed can be achieved independently in various embodiments of the disclosure or may be combined in yet other embodiments further details of which can be seen with reference to the following description and drawings.

BRIEF DESCRIPTION OF THE DRAWINGS

The disclosure can be better understood with reference to the following detailed description taken in conjunction with the accompanying drawings which illustrate preferred and exemplary embodiments, but which are not necessarily drawn to scale, wherein:

FIG. 1 is an illustration of a prior art hybrid wing body aircraft for which exemplary embodiments of a method and system of the disclosure may be used in connection with;

DETAILED DESCRIPTION

Disclosed embodiments will now be described more fully hereinafter with reference to the accompanying drawings, in which some, but not all of the disclosed embodiments are shown. Indeed, several different embodiments may be provided and should not be construed as limited to the embodiments set forth herein. Rather, these embodiments are provided so that this disclosure will be thorough and complete and will fully convey the scope of the disclosure to those skilled in the art.

Figure 1:
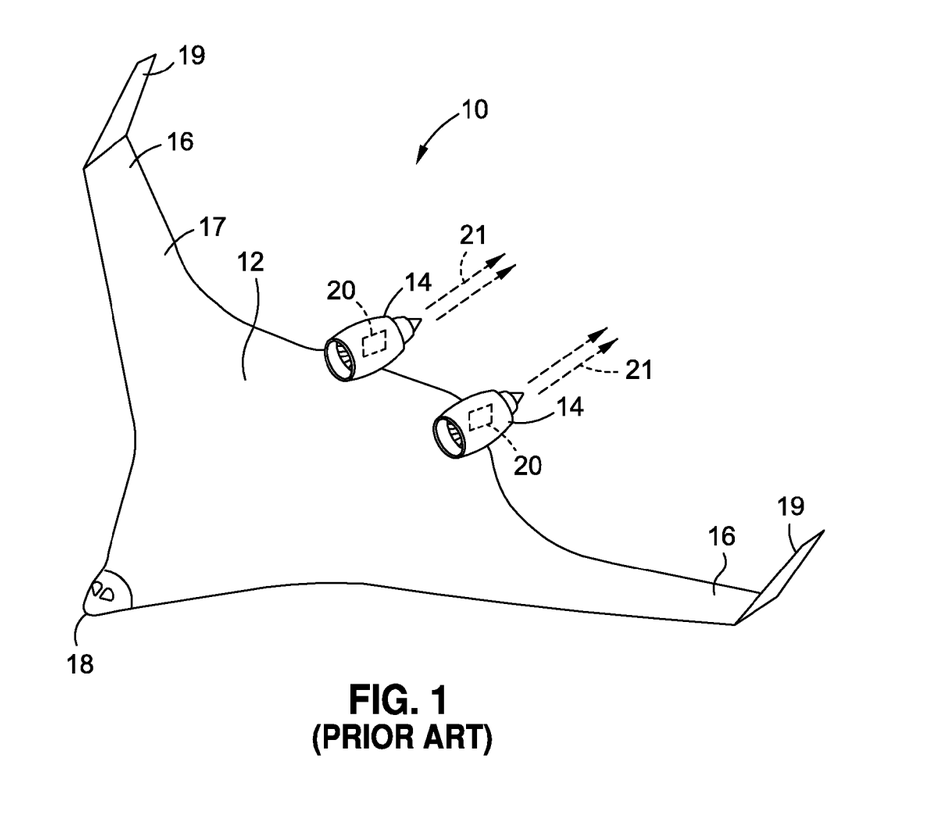

FIG. 1 is an illustration of a prior art hybrid wing body aircraft 10 for which exemplary embodiments of a method 100 (see FIG. 6), a method 200 (see FIG. 8), a method 300 (see FIG. 9), and a system 130 (see FIG. 7) of the disclosure may be used in connection with. As shown in FIG. 1, the aircraft 10 comprises a lifting airfoil-shaped body 12, one or more engines 14, one or more wings 16 smoothly blended into the body 12, a nose 18, and one or more wing tips 19. Preferably, the engines 14a, 14b may be mounted on top 17 of the wings 16 and/or body 12. A noise source 20 is preferably located within the engines 14, representing engine fan and turbine noise sources, and a noise source 21 is preferably located downstream of the engine 14, representing the noise source due to the jet flow. The hybrid wing body aircraft 10 can provide efficient high-lift wings and a wide airfoil-shaped body to enable the entire hybrid wing body aircraft 10 to contribute to lift generation with the result of potentially increased fuel economy. In addition, the hybrid wing body aircraft 10 can result in a reduction of engine noise as compared to known tube-and-wing aircraft. For example, the hybrid wing body aircraft 10 may have the potential to reduce noise to 42 dB (decibels) below Stage 4, which is the Federal Aviation Authority (FAA) regulation currently in use for aircraft noise certification, as compared to known tube-and-wing aircraft. In addition, vertical tails (not shown) positioned at the wing tip 19 or positioned at a location inboard of the wing tip 19 can provide shielding of the engine noise at sideline locations. The hybrid wing body aircraft 10 can also provide increased shielding of engine noise by the body 12. For example, the engines may be moved forward and, instead of winglets, another embodiment of the hybrid wing body aircraft may have vertical tails (not shown) on either side of the engines to block the engine noise.

Figure 2:
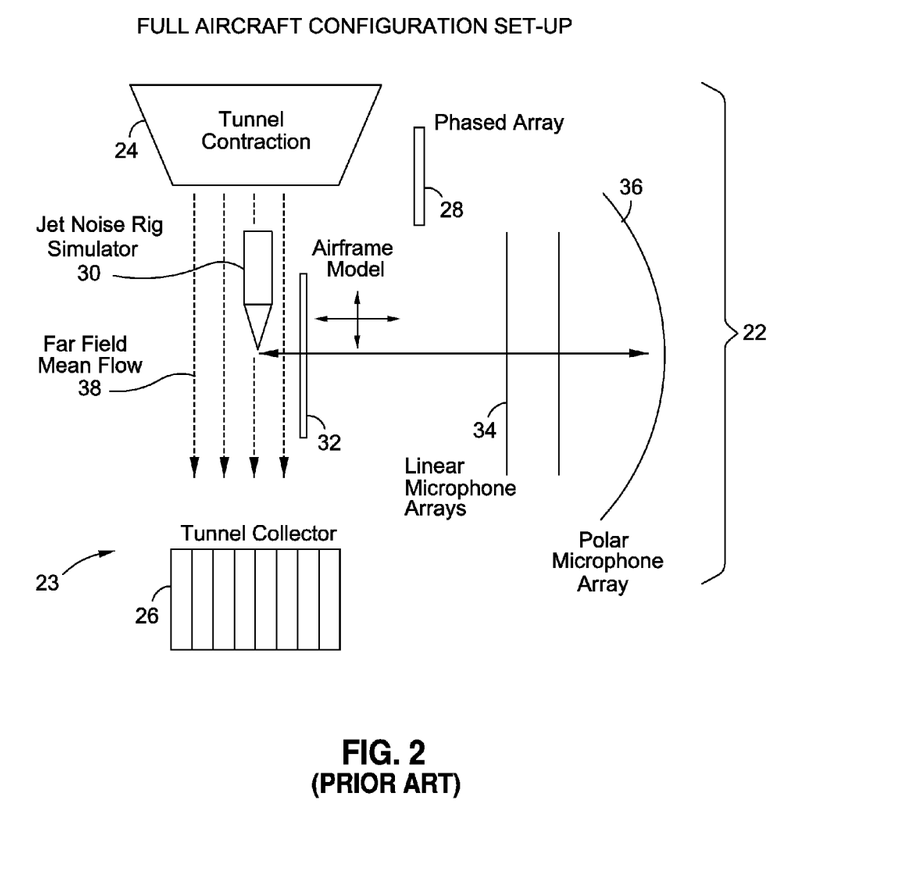
FIG. 2 is an illustration of a schematic diagram of a prior art embodiment of a full aircraft configuration set-up.

FIG. 2 is an illustration of a schematic diagram of a prior art embodiment of a full aircraft configuration set-up 22, for example, an aeroacoustic wind tunnel testing set-up. As shown in FIG. 2, the full aircraft configuration set-up 22 comprises a tunnel contraction 24, a tunnel collector 26, a phased array 28, a jet noise rig simulator 30, an airframe model 32, one or more linear microphone arrays 34, a polar microphone array 36, and a far field mean flow 38 that flows out of the tunnel contraction 24 and into the tunnel collector 26.

Figure 3:
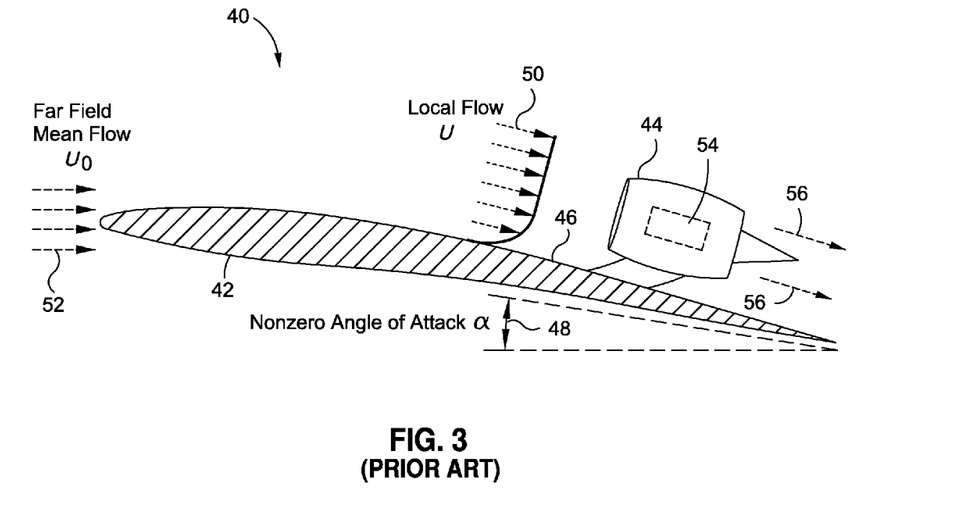
FIG. 3 is an illustration of a schematic diagram showing a side view of a prior art hybrid wing body aircraft at a nonzero angle of attack.

FIG. 3 is an illustration of a schematic diagram showing a side view of a prior art hybrid wing body aircraft 40 at a nonzero angle of attack ($\alpha$) 48. The hybrid wing body aircraft 40 comprises a lifting airfoil-shaped body 42 with an engine 44 mounted on top 46 of the body 42. The lifting airfoil-shaped body 42 at the nonzero angle of attack 48 can significantly alter a local flow (U) 50, such as a Mach number magnitude and a vector velocity field in front of or upstream of the body 42 and the engine 44, due to the effect of lift generation. On top 46 of the hybrid wing body aircraft 40, velocity of the local flow 50 is higher than velocity of a far field uniform mean flow ($U_0$) 52 upstream of the hybrid wing body aircraft 40 because of the circulation induced by the hybrid wing body aircraft 40. The higher velocity of the local flow 50 experienced by the engine 44 can, in turn, significantly change an engine noise source 54 and a jet noise source 56, in spectral features, absolute levels, as well as spatial distributions, in comparison with an engine in a uniform mean flow. This not only affects engine noise radiation efficiency of the engine noise source 54 and jet noise efficiency of the jet noise source 56, but also impacts engine noise shielding efficiency, since the engine noise shielding depends on how the engine noise source 54 or sources are distributed.

FIG. 4 is an illustration of a schematic diagram showing a side view of a prior art small scale aircraft model test configuration set-up 60 at a zero angle of attack 68. The small scale aircraft model test configuration set-up 60 may comprise a flat plate 62 with an engine 64 or engine simulator mounted on top 66 of the flat plate 62. With this small scale test configuration set-up 60, a local flow (U) 70 in front of the engine 64 or engine simulator is equal to a far field mean flow ($U_0$) 72 in front of or upstream of the flat plate 62 and the engine 64. The local flow 70 in front of the engine 64 or engine simulator can be considered the same as the far field mean flow 72 since the flat plate 62 only has a small distortion effect on the far field mean flow 72. A plurality of microphones 74 are placed in an arc 76 below the flat plate 62. The microphones 74 measure noise from an engine noise source 78 and a jet noise source 79.

Figure 5:
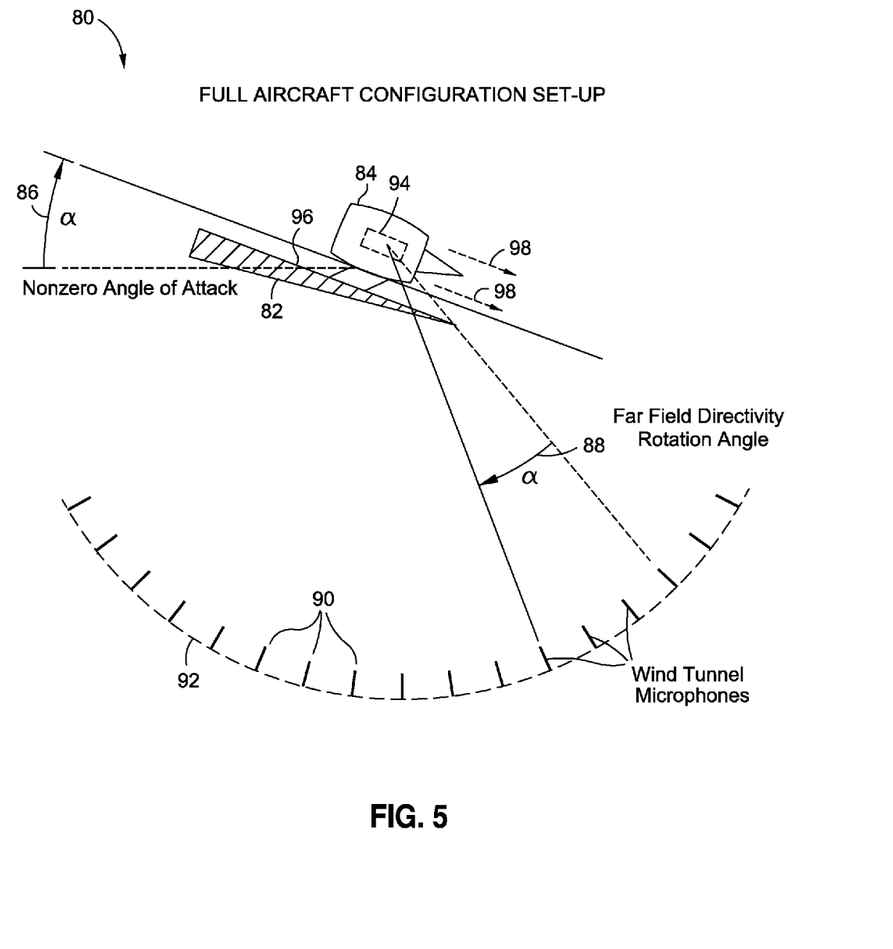
FIG. 5 is an illustration of a schematic diagram showing a side view of a full aircraft configuration set-up at a nonzero angle of attack rotated in a far field directivity rotation angle.

FIG. 5 is an illustration of a schematic diagram showing a side view of a full aircraft configuration set-up 80 at a nonzero angle of attack ($\alpha$) 86 rotated in a far field directivity rotation angle ($\alpha$) 88 which should be equal to the aircraft nonzero angle of attack ($\alpha$) 86. The full aircraft configuration set-up 80 comprises a hybrid wing body aircraft 82 having an engine 84 or engine simulator mounted on top 96 of the hybrid wing body aircraft 82. A plurality of microphones 90 are place in an arc 92 below the hybrid wing body aircraft 82. The microphones 90 measure noise from an engine noise source 94 and a jet noise source 98. The noise measurements from the engine noise source 94 and the jet noise source 98 are rotated at a far field directivity rotation angle ($\alpha$) 88 that is equal to the nonzero angle of attack ($\alpha$) 86. The far field directivity rotation angle ($\alpha$) 88 preferably matches a correct aircraft noise radiation pattern.

Figure 7:
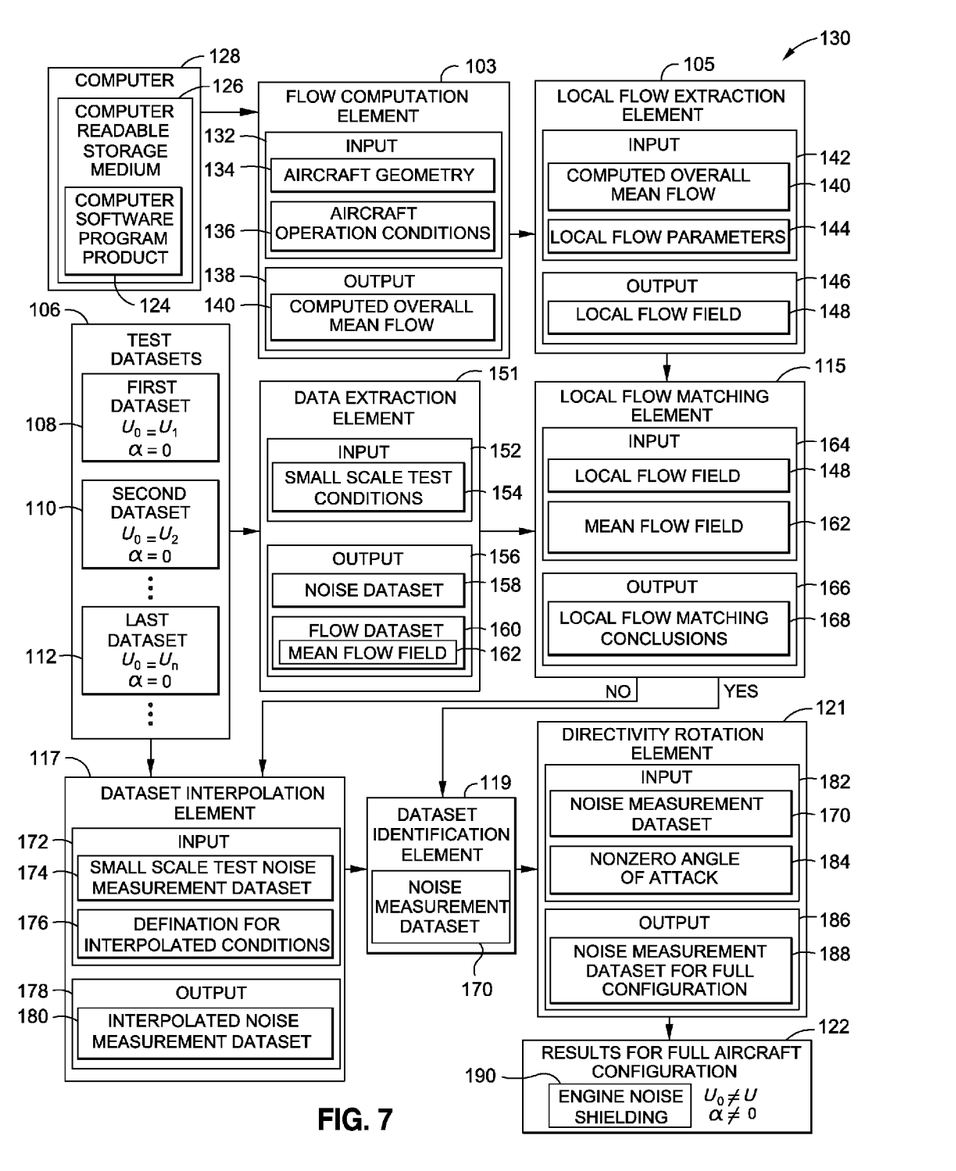
FIG. 7 is an illustration of a functional block diagram of one of the exemplary embodiments of the system of the disclosure.

In one embodiment of the disclosure, there is provided a system 130 to account for aircraft angle of attack effects in engine noise shielding tests in aircraft configurations having one or more engines 14 (see FIG. 1), 44 (see FIG. 3), or 84 (see FIG. 5) mounted above a wing 16 (see FIG. 1) or a lifting body 12 (see FIG. 1), 42 (see FIG. 3), or 82 (see FIG. 5). FIG. 7 is an illustration of a functional block diagram of one of the exemplary embodiments of the system 130 of the disclosure. Preferably, the one or more engines 14 (see FIG. 1), 44 (see FIG. 3), or 84 (see FIG. 5) mounted above the wing 16 (see FIG. 1) or the lifting body 12 (see FIG. 1), 42 (see FIG. 3), or 82 (see FIG. 5), are substantially shielded by a top 17 (see FIG. 1) of the wing 12 or a top 46 (see FIG. 3) of the lifting body 42. The system 130 may be preferably implemented with a computer software program product 124 stored on a computer readable storage medium 126 on a computer 128. Preferably, the computer software program product 124 comprises codes for steady flow computations, either a potential flow solver based on Euler's equation for fluid flow as an approximation to the real flow, or full viscous flow solver based on Computational Fluid Dynamics (CFD), both with corresponding grid generation software, or another suitable computer software program product. As used herein, Computational Fluid Dynamics (CFD) means one of the branches of fluid mechanics that uses numerical methods and algorithms to solve and analyze problems that involve fluid flows. Computers are used to perform the millions of calculations required to simulate the interaction of liquids and gases with surfaces defined by boundary conditions.

As shown in FIG. 7, the system 130 comprises a flow computation element 103 that generates a computed overall mean flow 140 from a known standard full aircraft configuration set-up 22 (see FIG. 2) or 80 (see FIG. 5) oriented at a nonzero angle of attack 86 (see FIG. 5). As shown in FIG. 2, preferably, the full aircraft configuration set-up 22 comprises at least an airframe model 32. In another embodiment, the full aircraft configuration set-up may comprise a full scale aircraft configuration. The flow computation element 103 preferably has a flow computation input 132 comprising a known standard aircraft geometry 134 and known standard aircraft operation conditions 136 from the full aircraft configuration set-up 22 or 80. The standard aircraft geometry 134 may comprise the geometry outline of the airframe structure, and the geometry of the high lift system, including the wings, the slats and the flaps, or other suitable standard aircraft geometry. The known standard aircraft operation conditions 136 may comprise such conditions as engine power, angle of attack, roll, flight path, altitude, far field mean flow, flight speed, and ambient conditions such as temperature and pressure, or other suitable aircraft operation conditions. The flow computation element 103 preferably further has a flow computation output 138 comprising the computed overall mean flow 140. The computed overall mean flow 140 is preferably computed from such factors as the air flow velocity over the engine, the air flow velocity over the wings, the air flow velocity over the fuselage, and pressure, temperature, and density of the aircraft, or other suitable computational factors.

As shown in FIG. 7, the system 130 further comprises a local flow extraction element 105 that generates a local flow field 148 from the full aircraft configuration set-up 22 or 80. The local flow extraction element 105 preferably has a local flow extraction input 142 comprising the computed overall mean flow 140 and a plurality of known standard local flow parameters 144, such as the locations of the local flow extraction from the full aircraft configuration set-up 22 or 80. The local flow extraction element 105 preferably further has a local flow extraction output 146 comprising the local flow field 148, which comprises flow quantities such as the flow Mach number distribution, the velocity vector field, the total pressure, and other suitable flow quantities.

The system 130 further comprises a data extraction element 151 that generates a mean flow field 162 from a small scale aircraft model test configuration set-up 60 (see FIG. 4) oriented at a zero angle of attack 68 (see FIG. 4). As shown in FIG. 4, preferably, the small scale aircraft model test configuration set-up 60 comprises one or more engines 64 or engine simulators mounted over a flat plate 62 oriented at a zero angle of attack 68. The small scale aircraft model test configuration set-up 60 is preferably easy and inexpensive to make and requirements for the test facility for housing the small scale aircraft model test configuration set-up 60 may be dictated only by the size of the engine 64 or engine simulators and not the size of any aircraft model.

Preferably, the mean flow field 162 is a far field mean flow 72 (see FIG. 4) in front of the one or more engines 64 or engine simulators of the small scale aircraft model test configuration set-up 60. The data extraction element 151 preferably has a data extraction input 152 comprising small scale test conditions 154 from the small scale aircraft model test configuration set-up 60. The small scale test conditions 154 are generated from a plurality of test datasets 106, for example, a first test dataset 108, a second test dataset 110, a last dataset 112 and other datasets in between. Preferably, the number of test datasets 106 may range from about 20 test datasets 106 for a single engine location and operation conditions, to about 1000 test datasets 106 for multiple engine locations and operation conditions. The test datasets 106 are preferably generated during tests with the small scale aircraft model test configuration set-up 60. The small scale test conditions 154 may comprise such conditions as ambient temperature, ambient pressure, the test Mach number, engine locations and engine operation conditions, or other suitable small scale test conditions. The data extraction element 151 preferably further has a data extraction output 156 comprising a noise dataset 158 and a flow dataset 160. Preferably, the flow dataset 160 comprises the mean flow field 162. When the mean flow field 162 of the test datasets 106 of the small scale aircraft model test configuration set-up 60 are applied to the local flow field 148 of the full aircraft configuration set-up 22 or 80 at the nonzero angle of attack 86, mean flow computations can be performed first to find the local flow field 148 on the top of the wing or body of the aircraft, at the desired angle of attack, which will be higher than the mean flow field 162 away from the aircraft due to the circulating flow around the wing or body.

The system 130 further comprises a local flow matching element 115 that generates a plurality of local flow matching conclusions 168. The local flow matching element 115 preferably has a local flow matching input 164 comprising the local flow field 148 and the mean flow field 162. The local flow matching element 115 preferably further has a local flow matching output 166 comprising the plurality of local flow matching conclusions 168. The system 130 further comprises a dataset identification element 119 preferably comprising a noise measurement dataset 170 at various far field angles. The local flow matching element 115 compares the local flow field 148 with the mean flow field 162, such that if there is a match or "YES" (see FIG. 7) between the local flow field 148 and the mean flow field 162, the mean flow field 162 is selected as the dataset identification element 119. Preferably, if there is a tolerance difference of 5% or less between the local flow field 148 and the mean flow field 162, there is a match or "YES" between the local flow field 148 and the mean flow field 162. The local flow matching element 115 compares the local flow field 148 with the mean flow field 162, such that if there is not a match or "NO" (see FIG. 7) between the local flow field 148 and the mean flow field 162, a dataset interpolation element 117 is used to perform a dataset interpolation to obtain the dataset identification element 119. Preferably, if there is a tolerance difference of greater than 5% between the local flow field 148 and the mean flow field 162, there is not a match or "NO" between the local flow field 148 and the mean flow field 162 and dataset interpolation is performed. The dataset interpolation element 117 preferably has a dataset interpolation input 172 comprising a noise measurement dataset 174 from the small scale aircraft model test configuration set-up 60 and a definition for interpolated conditions 176. The dataset interpolation element 117 preferably further has a dataset interpolation output 178 comprising an interpolated noise measurement dataset 180. Thus, the noise measurement dataset 170 may be noise measurement from the small scale aircraft model test configuration set-up 60. The dataset identification element 119 is preferably in the form of a noise measurement dataset 170.

The system 130 further comprises a directivity rotation element 121 that generates a noise measurement dataset 188 for the full aircraft configuration set-up 22 or 80. Once the dataset identification element 119 is selected and identified, the dataset identification element 119, preferably comprising the noise measurement dataset 170, is rotated in a far field directivity rotation angle 88 (see FIG. 5) to match the nonzero angle of attack 86 (see FIG. 5) to derive the correct far field radiation pattern and directivity. The directivity rotation element 121 preferably has a directivity rotation input 182 comprising the noise measurement dataset 170 and a nonzero angle of attack 184 which is the same as the aircraft angle of attack 86 in FIG. 5. The directivity rotation element 121 preferably further has a directivity rotation output 186 comprising the noise measurement dataset 188 for the full aircraft configuration set-up 22 or 80.

The system 130 further comprises a results dataset 122 for the full aircraft configuration set-up 22 or 80 at the nonzero angle of attack 184 or 86. Preferably, the results dataset 122 comprises engine noise shielding 190 for the full aircraft configuration set-up 22 or 80 at the nonzero angle of attack 184 or 86. Preferably, the system 130 reduces costs and saves time by avoiding conducting large scale wind tunnel tests and full scale aircraft flight tests and actual testing with a full aircraft configuration set-up 22 or 80 and by using small scale aircraft model test configuration data to account for nonzero angle of attack effects. The system 130 allows for the use of data from tests using the small scale aircraft model test configuration set-up 60 to be used to compute how much engine noise is reduced for an actual aircraft.

Figure 6:
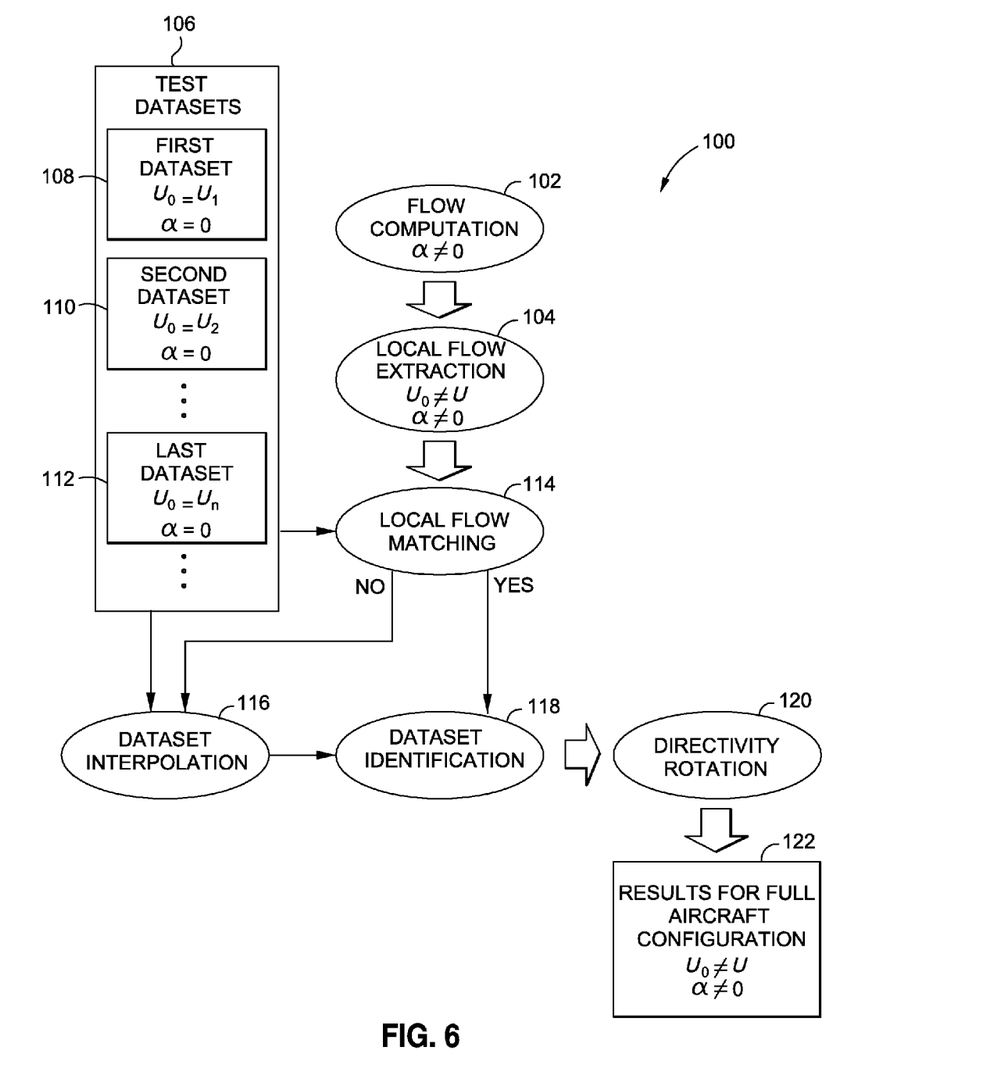
FIG. 6 is an illustration of a schematic flow diagram showing one of the exemplary embodiments of the method of the disclosure.
Figure 8:
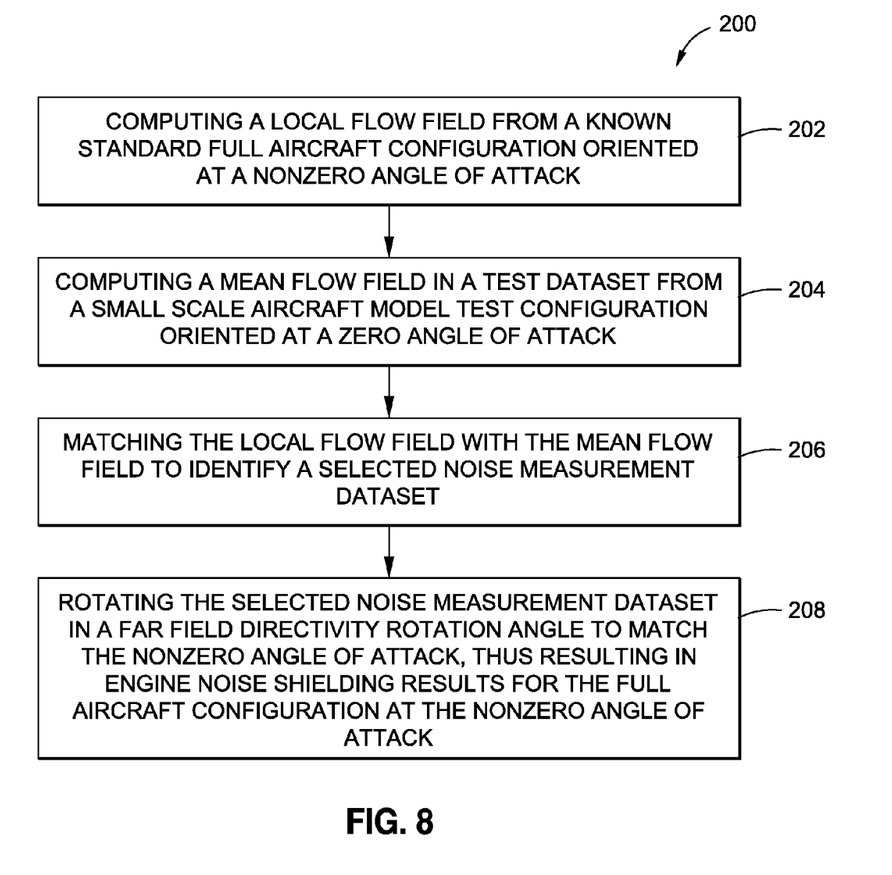
FIG. 8 is a flow diagram illustrating one of the exemplary embodiments of the method of the disclosure; and, FIG. 9 is a flow diagram illustrating another one of the exemplary embodiments of the method of the disclosure.
Figure 9:
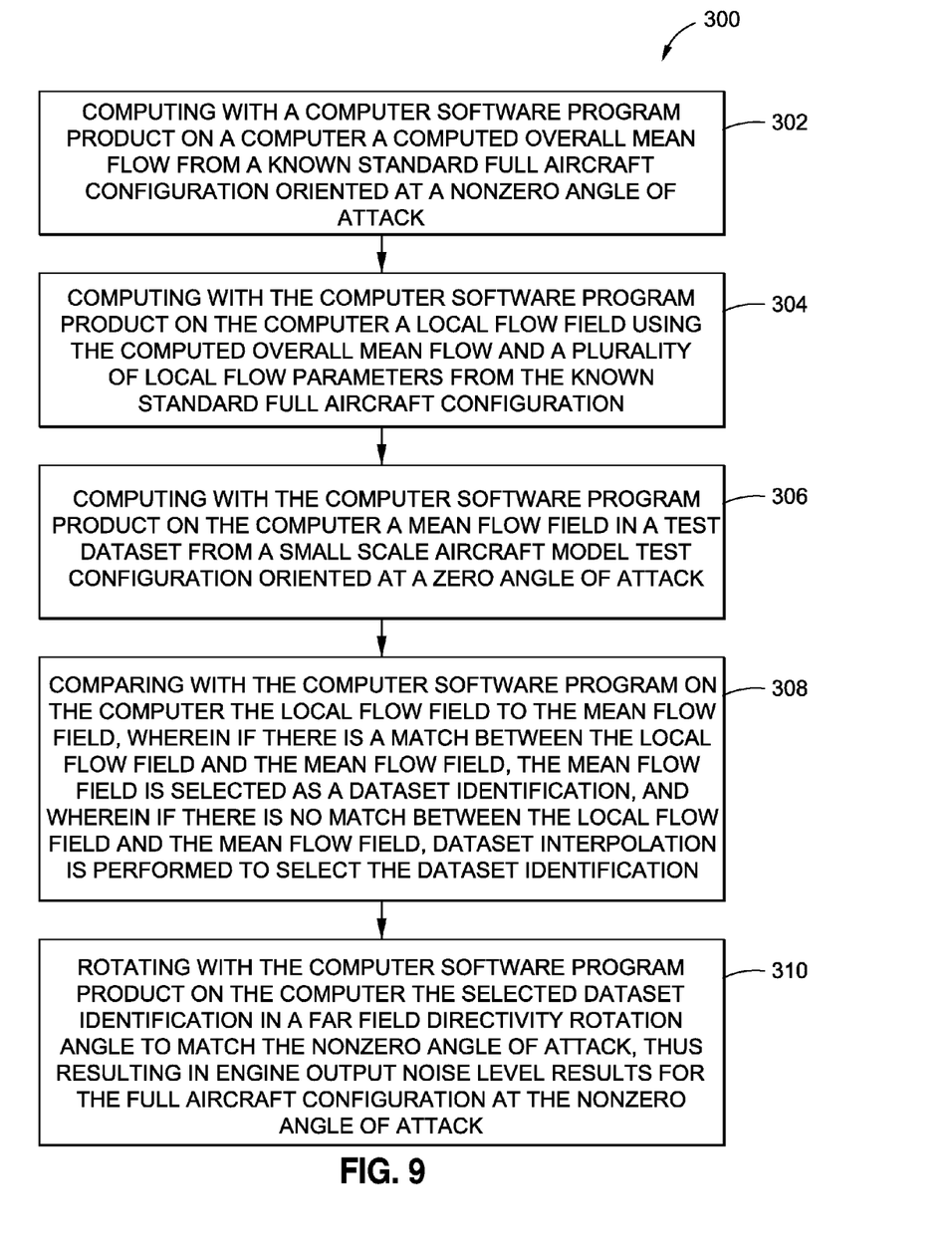

In other embodiments of the disclosure there are provided method 100 (see FIG. 6), method 200 (see FIG. 8), and method 300 (see FIG. 9). FIG. 6 is an illustration of a schematic flow diagram showing one of the exemplary embodiments of the method 100 of the disclosure. The method 100 comprises a plurality of operations comprising flow computation 102, local flow extraction 104, local flow matching 114, dataset identification 118, directivity rotation 120, and a results dataset 122 for a full aircraft configuration set-up 22 (see FIG. 2) or 80 (see FIG. 5). With the flow computation 102, the angle of attack ($\alpha$) is not equal to zero (0), i.e., nonzero degrees. The flow computation 102 uses known standard method and input parameters from the full aircraft configuration set-up 22 (see FIG. 2) or 80 (see FIG. 5) having a nonzero angle of attack. With the local flow extraction 104, the angle of attack (α) is not equal to zero (0), i.e., nonzero degrees, and the far field mean flow $U_0$ is not equal to the local flow U. The local flow matching 114 uses a plurality of test datasets 106 comprising, for example, a first test dataset 108, a second test dataset 110, a last dataset 112, and other datasets in between, based on test conditions using an exemplary small scale aircraft model test configuration set-up 60 (see FIG. 4). For the first test dataset 108, the angle of attack (α) is equal to zero (0), i.e., zero degrees, and the far field mean flow $U_0$ is equal to the local flow $U_1$ of the first test dataset 108. For the second test dataset 110, the angle of attack (α) is equal to zero (0), i.e., zero degrees, and the far field mean flow $U_0$ is equal to the local flow $U_2$ of the second test dataset 110. For the last test dataset 112, the angle of attack (α) is equal to zero (0), i.e., zero degrees, and the far field mean flow $U_0$ is equal to the local flow $U_n$ of the last test dataset 112. For the results dataset 122 for the full aircraft configuration set-up 22 (see FIG. 2) or 80 (see FIG. 5), the angle of attack (α) is not equal to zero (0), i.e., nonzero degrees, and the far field mean flow $U_0$ is not equal to the local flow U.

FIG. 8 is a flow diagram illustrating one of the exemplary embodiments of a method 200 of the disclosure. The method 200 accounts for aircraft angle of attack effects in engine noise shielding tests in aircraft configurations having one or more engines 14 (see FIG. 1), 44 (see FIG. 3), or 84 (see FIG. 5) mounted above a wing 16 (see FIG. 1) or a lifting body 12 (see FIG. 1), 42 (see FIG. 3), or 82 (see FIG. 5). Preferably, the one or more engines 14, 44, 84 mounted above the wing 16 or the lifting body 12, 42, 82 are substantially shielded by a top 17 (see FIG. 1) of the wing 12 or a top 46 (see FIG. 3) of the lifting body 42. Preferably, the method 200 is implemented using a computer software program product 124 (see FIG. 7) stored on a computer readable storage medium 126 (see FIG. 7) on a computer 128 (see FIG. 7).

The method 200 comprises step 202 of computing a local flow field 148 (see FIG. 7) from a known standard full aircraft configuration set-up 22 (see FIG. 2) or 80 (see FIG. 5) oriented at a nonzero angle of attack 86 (see FIG. 5). As shown in FIG. 2, preferably, the full aircraft configuration set-up 22 comprises at least an airframe model 32 and a model engine or jet simulator 30. The full aircraft configuration set-up 22 may further comprise full scale aircraft flight conditions or tests with all high lift devices (slats and flaps) deployed. Step 202 of computing the local flow field 148 may further comprise computing a computed overall mean flow 140 (see FIG. 7) for the full aircraft configuration set-up 22 or 80 and using the computed overall mean flow 140 and a plurality of local flow parameters 144 (see FIG. 7) of the full aircraft configuration set-up 22 or 80 to generate the local flow field 148. Preferably, the local flow field 148 is a local flow 50 (see FIG. 3) in front of one or more engines 44 of the full aircraft configuration set-up 22 or 80.

The method 200 further comprises step 204 of computing a mean flow field 162 (see FIG. 7) in a test dataset 106 (see FIG. 7) from a small scale aircraft model test configuration set-up 60 (see FIG. 4) oriented at a zero angle of attack 68 (see FIG. 4). As shown in FIG. 4, preferably, the small scale aircraft model test configuration set-up 60 comprises one or more engines 64 or engine simulators mounted over a flat plate 62 oriented at a zero angle of attack 68. Preferably, the mean flow field 162 is a far field mean flow 72 (see FIG. 4) in front of one or more engines 64 of the small scale aircraft model test configuration set-up 60.

The method 200 further comprises step 206 of matching the local flow field 148 of the full configuration aircraft at nonzero angle of attack (see FIG. 7) with the mean flow field 162 (see FIG. 7) of the simple small scale tests of the small scale aircraft model test configuration set-up 60 (see FIG. 4) to identify a selected noise measurement dataset 170 (see FIG. 7). Preferably, the step 206 of matching the local flow field 148 with the mean flow field 162 further comprises comparing the local flow field 148 to the mean flow field 162, such that if there is a match between the local flow field 148 and the mean flow field 162, the mean flow field 162 is the selected noise measurement dataset 170, and such that if there is not a match between the local flow field 148 and the mean flow field 162, dataset interpolation 116 (see FIG. 6) is performed to obtain the selected noise measurement dataset 170. The method 200 further comprises step 208 of rotating the selected noise measurement dataset 170 in a far field directivity rotation angle 88 (see FIG. 5) to match the nonzero angle of attack 86 (FIG. 5), thus resulting in engine noise shielding results 122 (see FIG. 7) for the full aircraft configuration set-up 22 or 80 at the nonzero angle of attack 86. Preferably, the method 200 reduces costs and saves time by avoiding conducting large scale wind tunnel tests or full aircraft flight tests by using test datasets 106 from the small scale aircraft model test configuration set-up 60 to account for the nonzero angle of attack 86 effects.

FIG. 9 is a flow diagram illustrating another one of the exemplary embodiments of a method 300 of the disclosure. The method 300 determines operational engine output noise levels as related to angles of attack in aircraft configurations for which one or more engines 14 (see FIG. 1), 44 (see FIG. 3), or 84 (see FIG. 5) are mounted above a wing 16 (see FIG. 1) or a lifting body 12 (see FIG. 1), 42 (see FIG. 3), or 82 (see FIG. 5) and preferably, where the one or more engines 14, 44, 84 mounted above the wing 16 or the lifting body 12, 42, 82 are substantially shielded by the wing 16 or the lifting body 42.

The method 300 comprises step 302 of computing with a computer software program product 124 (see FIG. 7) stored on a computer readable storage medium 126 (see FIG. 7) on a computer 128 (see FIG. 7), a computed overall mean flow 140 (see FIG. 7) from a known standard full aircraft configuration set-up 22 (see FIG. 2) or 80 (see FIG. 5) oriented at a nonzero angle of attack 86 (see FIG. 5). As shown in FIG. 2, preferably, the full aircraft configuration set-up 22 comprises at least an airframe model 32. The full aircraft configuration set-up 22 may further comprise full scale aircraft flight conditions or tests.

The method 300 further comprises step 304 of computing with the computer software program product 124 on the computer 128 a local flow field 148 (see FIG. 7) using the computed overall mean flow 140 and a plurality of local flow parameters 144 from the known standard full aircraft configuration set-up 22, 80. Preferably, the local flow field 148 is a local flow 50 (see FIG. 3) in front of one or more engines 44 of the full aircraft configuration set-up 22, 80.

The method 300 further comprises step 306 of computing with the computer software program product 124 on the computer 128 a mean flow field 162 (see FIG. 7) in a test dataset 106 (see FIG. 7) from a small scale aircraft model test configuration set-up 60 (see FIG. 4) oriented at a zero angle of attack 68 (see FIG. 4). Preferably, the mean flow field 162 is a far field mean flow 72 (see FIG. 4) in front of one or more engines 64 of the small scale aircraft model test configuration set-up 60. As shown in FIG. 4, preferably, the small scale aircraft model test configuration set-up 60 comprises one or more engines 64 or engine simulators mounted over a flat plate 62 oriented at a zero angle of attack 68.

The method 300 further comprises step 308 of comparing with the computer software program product 124 on the computer 128 the local flow field 148 to the mean flow field 162. If there is a match between the local flow field 148 and the mean flow field 162, the mean flow field 162 is identified as a selected dataset identification 118 (see FIG. 6). If there is no match between the local flow field 148 and the mean flow field 162, dataset interpolation 116 (see FIG. 6) is performed to obtain the selected dataset identification 118. Preferably, the selected dataset identification 118 comprises a noise measurement dataset 170 (see FIG. 7). The method 300 further comprises step 310 of rotating with the computer software program product 124 on the computer 128 the selected dataset identification 118 in a far field directivity rotation angle 88 (see FIG. 5) to match the nonzero angle of attack 86 (FIG. 5), thus resulting in engine output noise level results 122 (see FIG. 7) for the full aircraft configuration set-up 22 or 80 at the nonzero angle of attack 86.

Preferably, the method 300 reduces costs and saves time by avoiding conducting large scale wind tunnel tests and full scale aircraft flight tests by using test datasets 106 from the small scale aircraft model test configuration set-up 60 to account for the nonzero angle of attack 86 effects.

Embodiments of the system and method of the disclosure may provide significant advantages over known systems and methods. Embodiments of the disclosed system and methods provide for a computational determination of operational engine output noise levels as related to angles of attack in aircraft configurations for which one or more engines are positionally mounted above and substantially shielded by the top of a wing, lifting body, or other structure. Embodiments of the disclosed system and method utilize test datasets from small scale aircraft model test configuration set-ups having angles of attack of zero degrees to account for the effects of angles of attack of nonzero degrees in full aircraft configurations.

Embodiments of the disclosed system and methods perform a mean flow computational analysis for a known standard full aircraft configuration for which noise shielding data at defined flow conditions and nonzero angle of attack are desired. Results of the computational analysis can be used to extract local flow field in front of the engine of the full aircraft test configuration at a nonzero angle of attack, and this local flow field can then be matched with the mean flow field in a small scale aircraft model test configuration set-up at a zero angle of attack at a corresponding local location in front of the engine, for which case noise shielding data is available.

Embodiments of the disclosed system and methods match the local flow field in front of the engine in full aircraft configurations at nonzero angles of attack to a corresponding mean flow field in the small scale aircraft model test configuration set-up tests at zero angles of attack, so that the similarity of engine noise sources between the two small and full configurations or models may be established. Embodiments of the disclosed system and methods match the local flow conditions between the two small and full configurations or models, one being the full aircraft configuration in practical applications and the other being the simple small scale aircraft model test configuration, and when such matching occurs, the system and methods use the available test datasets from the simple small scale aircraft model test configuration for the practical applications of the full aircraft configuration. This can be achieved because it is the local flow field in front of the engine that determines the engine noise source characteristics, regardless of how that local flow field is generated. Since it is the local flow field that affects the engine noise sources and the shielding effects of the aircraft wings and body, the engine noise generation process and shielding propagation process of the two small and full configurations follow similar rules. Thus, the two small and full configurations with the same local flow field will lead to the same noise shielding characteristics, even though the flow and geometry conditions away from the engine may differ significantly between the two small and full configurations. If there is an inflow match, the test dataset from the simple small scale aircraft model test configuration at this condition can be identified and selected. If there is no exact match, conditions close to the full aircraft configuration can be identified with a data interpolation performed to construct a dataset for the full aircraft configuration. The identified and constructed dataset is rotated in a far field directivity angle to match the nonzero angle of attack, which leads to the final results for engine noise shielding for the full aircraft configuration at a nonzero angle of attack. Embodiments of the disclosed system and methods thus provide for simple rotation of the far field data to match the directivity, and enable the test datasets from the simple small scale aircraft model test configuration to be extended to the fully installed full aircraft configuration, thus accounting for the full aircraft configuration effects of aircraft angle of attack on engine noise shielding.

In addition, embodiments of the disclosed system and methods account for the effects of aircraft angle of attack in engine noise shielding without having to conduct full aircraft configuration tests by using test datasets from the simple small scale aircraft model test configuration tests at zero angle of attack to account for the effects of nonzero angle of attack in such full aircraft configuration tests. This avoids costly and time-consuming large scale full aircraft configuration tests, such as full aircraft configurations using a large wind tunnel assembly or full scale aircraft flight conditions or tests.

Many modifications and other embodiments of the disclosure will come to mind to one skilled in the art to which this disclosure pertains having the benefit of the teachings presented in the foregoing descriptions and the associated drawings. The embodiments described herein are meant to be illustrative and are not intended to be limiting or exhaustive. Although specific terms are employed herein, they are used in a generic and descriptive sense only and not for purposes of limitation.

What is claimed is:

1. A method to account for aircraft angle of attack effects in engine noise shielding tests in aircraft configurations having one or more engines mounted above a wing or a lifting body, the method implemented using a computer software program product stored on a computer readable storage medium on a computer, the method comprising:

computing with a computer software program product stored on a computer readable storage medium on a computer a local flow field from a full aircraft configuration oriented at a nonzero angle of attack to obtain a computed overall local flow output computed from one or more local flow parameters comprising a Mach number distribution, a velocity vector field, a total pressure, and a total temperature, the full aircraft configuration comprising a hybrid wing body aircraft having one or more engines mounted above a wing or a lifting body of the hybrid wing body aircraft;

computing with the computer software program product on the computer a mean flow field in a test dataset from an aircraft model test configuration oriented at a zero angle of attack to obtain one or more test conditions comprising a Mach number distribution, a velocity vector field, a total pressure, and a total temperature, the aircraft model test configuration comprising one or more engines mounted over a flat plate;

comparing with the computer software program product on the computer the local flow field with the mean flow field to identify a selected noise measurement dataset; and, rotating with the computer software program product on the computer the selected noise measurement dataset in a far field directivity rotation angle to match the nonzero angle of attack, thus resulting in engine noise shielding results for the full aircraft configuration at the nonzero angle of attack.

2. The method of claim 1 wherein computing the local flow field further comprises computing a computed overall mean flow for the full aircraft configuration and using the computed overall mean flow and the one or more local flow parameters of the full aircraft configuration to generate the local flow field.

3. The method of claim 1 wherein the local flow field is in front of one or more engines of the full aircraft configuration, and wherein the mean flow field is in front of one or more engines of the aircraft model test configuration.

4. The method of claim 1 wherein comparing the local flow field to the mean field further comprises if there is a match between the local flow field and the mean flow field, the mean flow field is the selected noise measurement dataset, and if there is not a match between the local flow field and the mean flow field, dataset interpolation is performed to obtain the selected noise measurement dataset.

5. The method of claim 1 wherein the full aircraft configuration comprises at least an airframe model and a wind tunnel assembly, or comprises full scale aircraft flight conditions.

6. The method of claim 1 wherein the aircraft model test configuration comprises one or more engine simulators mounted over the flat plate oriented at a zero angle of attack.

7. The method of claim 1 wherein the one or more engines mounted above the wing or the lifting body are substantially shielded by a top of the wing or a top of the lifting body.

8. The method of claim 1 wherein the method reduces costs and saves time by avoiding conducting large scale wind tunnel tests and full scale aircraft flight tests by using test datasets from the aircraft model test configuration to account for the nonzero angle of attack effects.

9. A method for determining operational engine output noise levels as related to angles of attack in aircraft configurations for which one or more engines are mounted above a wing or a lifting body and substantially shielded by the wing or the lifting body, the method comprising:

computing with a computer software program product on a computer a computed overall mean flow from a full aircraft configuration oriented at a nonzero angle of attack, the full aircraft configuration comprising a hybrid wing body aircraft having one or more engines mounted above a wing or a lifting body of the hybrid wing body aircraft;

computing with the computer software program product on the computer a local flow field using the computed overall mean flow and a plurality of local flow parameters from the full aircraft configuration, the plurality of local flow parameters comprising a Mach number distribution, a velocity vector field, a total pressure, and a total temperature;

computing with the computer software program product on the computer a mean flow field in a test dataset from an aircraft model test configuration oriented at a zero angle of attack to obtain one or more test conditions comprising a Mach number distribution, a velocity vector field, a total pressure, and a total temperature, the aircraft model test configuration comprising one or more engines mounted over a flat plate;

comparing with the computer software program product on the computer the local flow field to the mean flow field, wherein if there is a match between the local flow field and the mean flow field, the mean flow field is selected as a dataset identification, and wherein if there is no match between the local flow field and the mean flow field, dataset interpolation is performed to select the dataset identification; and, rotating with the computer software program product on the computer the selected dataset identification in a far field directivity rotation angle to match the nonzero angle of attack, thus resulting in engine output noise level results for the full aircraft configuration at the nonzero angle of attack.

10. The method of claim 9 wherein the local flow field is in front of one or more engines of the full aircraft configuration, and wherein the mean flow field is in front of one or more engines of the aircraft model test configuration.

11. The method of claim 9 wherein the full aircraft configuration comprises at least an airframe model and a wind tunnel assembly, or comprises full scale aircraft flight conditions.

12. The method of claim 9 wherein the aircraft model test configuration comprises one or more engine simulators mounted over a flat plate oriented at a zero angle of attack.

13. The method of claim 9 wherein the method reduces costs and saves time by avoiding conducting large scale wind tunnel tests and full scale aircraft flight tests by using test datasets from the aircraft model test configuration to account for the nonzero angle of attack effects.

14. A system to account for aircraft angle of attack effects in engine noise shielding tests in aircraft configurations having one or more engines mounted above a wing or a lifting body, the system implemented with a computer software program product stored on a computer readable storage medium on a computer, the system comprising:

a flow computation element that generates a computed overall mean flow from a full aircraft configuration oriented at a nonzero angle of attack, the full aircraft configuration comprising a hybrid wing body aircraft having one or more engines mounted above a wing or a lifting body of the hybrid wing body aircraft;

a local flow extraction element that generates a local flow field from the full aircraft configuration, the local flow field using the computed overall mean flow and a plurality of local flow parameters from the full aircraft configuration, the plurality of local flow parameters comprising a Mach number distribution, a velocity vector field, a total pressure, and a total temperature;

a data extraction element that generates a mean flow field from an aircraft model test configuration oriented at a zero angle of attack, the mean flow field being generated from a test dataset from the aircraft model test configuration to obtain one or more test conditions comprising a Mach number distribution, a velocity vector field, a total pressure, and a total temperature, the aircraft model test configuration comprising one or more engines mounted over a flat plate;

a local flow matching element that generates a plurality of local flow matching conclusions;

a dataset identification element comprising a noise measurement dataset from the aircraft model test configuration;

a directivity rotation element that generates a noise measurement dataset for the full aircraft configuration; and, a results dataset comprising engine noise shielding for the full aircraft configuration at the nonzero angle of attack.

15. The system of claim 14 wherein the flow computation element has a flow computation input comprising known standard aircraft geometry and aircraft operation conditions from the full aircraft configuration, and has a flow computation output comprising the computed overall mean flow.

16. The system of claim 14 wherein the local flow extraction element has a local flow extraction input comprising the computed overall mean flow and a plurality of known standard local flow parameters from the full aircraft configuration, and has a local flow extraction output comprising the local flow field.

17. The system of claim 14 wherein the data extraction element has a data extraction input comprising test conditions from the aircraft model test configuration, and has a data extraction output comprising a noise dataset and a flow dataset, the flow dataset comprising the mean flow field.

18. The system of claim 14 wherein the local flow matching element has a local flow matching input comprising the local flow field and the mean flow field, and has a local flow matching output comprising the plurality of local flow matching conclusions.

19. The system of claim 14 wherein the local flow matching element compares the local flow field with the mean flow field such that if there is a match between the local flow field and the mean flow field, the mean flow field is selected as the dataset identification element, and such that if there is not a match between the local flow field and the mean flow field, dataset interpolation is performed to obtain the dataset identification element.

20. The system of claim 19 wherein the dataset interpolation is performed with a dataset interpolation element having a dataset interpolation input comprising a noise measurement dataset from the aircraft model test configuration and a definition for interpolated conditions, and having a dataset interpolation output comprising an interpolated noise measurement dataset.

21. The system of claim 14 wherein the directivity rotation element has a directivity rotation input comprising the noise measurement dataset and a nonzero angle of attack, and has a directivity rotation output comprising the noise measurement dataset for the full aircraft configuration.

22. The system of claim 14 wherein the full aircraft configuration comprises at least an airframe model and a wind tunnel assembly, or comprises full scale aircraft flight conditions.

23. The system of claim 14 wherein the aircraft model test configuration comprises one or more engine simulators mounted over a flat plate oriented at a zero angle of attack.

24. The system of claim 14 wherein the method reduces costs and saves time by avoiding conducting large scale wind tunnel tests and full scale aircraft flight tests by using test datasets from the aircraft model test configuration to account for the nonzero angle of attack effects.

* * * * *